United States Patent [19]

Josefsson et al.

[11] Patent Number: 4,494,083
[45] Date of Patent: Jan. 15, 1985

[54] IMPEDANCE MATCHING STRIPLINE TRANSITION FOR MICROWAVE SIGNALS

[75] Inventors: Lars G. Josefsson, Askim; Bengt T. Svensson, Mölndal; Lars F. Moeschlin, Frölunda, all of Sweden

[73] Assignee: Telefonaktiebolaget L M Ericsson, Stockholm, Sweden

[21] Appl. No.: 384,976

[22] Filed: Jun. 4, 1982

[30] Foreign Application Priority Data

Jun. 30, 1981 [SE] Sweden ............................. 8104097

[51] Int. Cl.³ .......................................... H01P 5/00
[52] U.S. Cl. .................................... 333/33; 333/238; 333/246
[58] Field of Search ................ 333/33, 238, 246, 260; 361/412, 414; 339/17 M

[56] References Cited

U.S. PATENT DOCUMENTS 3,303,439 2/1967 Fulp .
3,533,023 10/1970 Friend .
3,757,272 9/1973 Laramee et al. ................ 333/238 X
3,895,435 7/1975 Turner et al. .................... 333/33 X
4,080,579 3/1978 Fassett .............................. 333/246 X
4,262,265 4/1981 Nygren et al. ................... 333/246 X

OTHER PUBLICATIONS

Microwave Transmission Circuits, publication 12/49 Radio Fernsehen Electronik, vol. 28, no. 8, 8/79, pp. 500-502.

Primary Examiner—Paul Gensler
Attorney, Agent, or Firm—Roberts, Spiecens & Cohen

[57] ABSTRACT

An impedance matching stripline transition for microwave signals which are conducted from a stripline circuit on one laminate (2) to another laminate (4) through a number of intermediate laminates (3). The connection between an incoming stripline circuit (21) on one laminate (2) to the outgoing stripline circuit (41) on the other laminate is performed as a short coaxial line. The outer conductor of the coaxial line is formed by a number of through-plated holes (12, 13, 23, 33, 43) in horseshoe form around a central conductor of through-plated holes (24, 34). The outer conductor is connected with the ground plane (31, 11, 45) of the laminates. They serve simultaneously as a suppressor of undesired modes in the microwave signals which are supplied to the transition via the conductor (21).

4 Claims, 4 Drawing Figures

IMPEDANCE MATCHING STRIPLINE TRANSITION FOR MICROWAVE SIGNALS

TECHNICAL FIELD

The present invention relates to an impedance matching stripline transition for microwave signals which connect a stripline circuit on a first laminate to a stripline circuit on a second laminate through a number of intermediate laminates.

BACKGROUND ART

In the microwave art sometimes so called stripline circuits are used instead of wave guides to conduct microwave signals. Such circuits consist of thin tapes or strips of conducting material, etched on laminates of dielectric material. An applicable area is in producing microwave antennas, described, for example, in U.S. Pat. No. 4,150,383. Such an antenna consists of dielectric slabs with the antenna elements formed as stripline circuits.

DISCLOSURE OF INVENTION

In antennas with stripline circuits of the above mentioned kind, the problem arises of impedance matching a stripline circuit on a dielectric slab to a stripline circuit on another slab. The two slabs need not necessarily be located close to each other but a connection is needed, for example, between the outermost of the slabs in the antenna, and a transition then must be provided, passing the intermediate slabs. A possibility would be to provide a connection in the form of a coaxial cable passing the intermediate slabs and to connect the terminals of the coaxial cable to the two stripline circuits. Such a connection will be relatively clumsy and, in addition, problems with the transition coax-stripline circuit will arise.

According to the invention said problem will be solved by a coaxial-like transition on the slabs such as through-plated holes, forming on the one hand a main conductor and on the other an outer conductor (screen) for the microwave signals. In that way a simple connection between the stripline circuits is obtained without any separate coaxial connection and associated transitions.

BRIEF DESCRIPTION OF DRAWING

The invention will be described in detail with reference to the accompanying drawing where.

MODE FOR CARRYING OUT THE INVENTION

Figure 1:
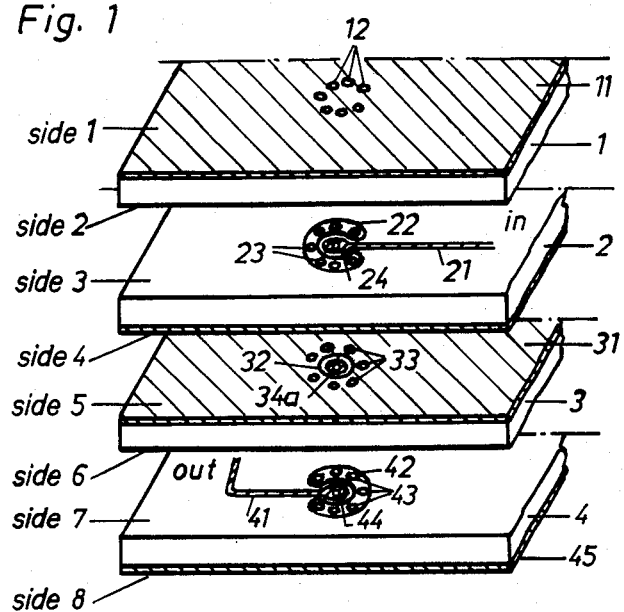
FIG. 1 is a perspective view of four laminate slabs on which the transition according to the invention is provided.
Figure 2:
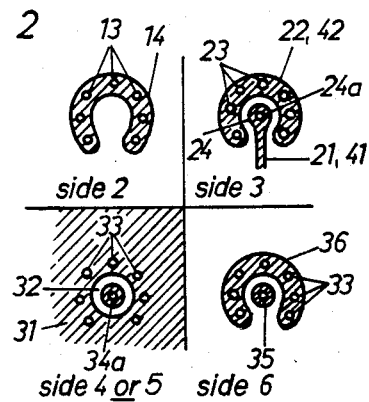
FIG. 2 shows the transition on various sides of the laminate according to FIG. 1.

The basic construction of a stripline transition according to the invention comprises, for example, four laminate slabs 1, 2, 3 and 4 coated on all sides with copper according to FIG. 1. The laminate slab 1 is coated on the upper side with a layer 11 of conducting material, for example copper. Through the slab there is a number of holes 12, which are through-plated and on the underside of the laminate 1 a horseshoe-shaped structure 14 of a conducting material (copper) has been formed. On the second laminate 2 a stripline circuit has been formed in known way in which conductor 21 forms an input conductor to the lead-through. The conductor 21 is terminated by a through-plated hole 24 and around the collar 24a of the hole a horseshoe-shaped structure 22 if formed, like the underside of the laminate 1 (side 2 according to FIG. 2), with through-plated holes 23 (FIG. 1). The upper side of the laminate 2 is denoted in FIG. 2 as side 3 and its underside (in FIG. 1 not shown) is denoted as side 4. On side 4 (laminate 2) the through-plated hole 24 ends in a collar 34a which along an open area 32 limited by the circular formed edge of the layer 31 lies isolated from the through-plated holes 33, constituting the continuation of the holes 12 (laminate 1) and holes 23 (laminate 2). The side 4 (laminate 2) is copper-coated like the upper side (side 5) of the laminate 3 and consists of a common ground plane for the stripline transition. On the upper side of the laminate 4 (side 7 in FIG. 1) a stripline circuit, in this embodiment not shown in detail, is arranged whose connecting conductor to the transition is denoted by 41. The conductor 41 is terminated by a collar 44 to fit the collar 35 on the underside (side 6) of the laminate 3. A horseshoe-shaped structure 42 is formed on the upper side of the laminate 4 (side 7) and has through-plated holes 43 through the laminate 4 to the coppercoated underside 45 (side 8) of the laminate 4. In this embodiment, the opening of the horseshoe-shaped structure of the holes 12, 23 and the copper surfaces 14, 22 is turned to the right in FIG. 1, while the opening of the corresponding holes 33, and the surfaces 36, 42 is turned to the left in FIG. 1.

The connection between the two layers of stripline circuits on the upper side (side 3) of the laminate 2 and the upper side (side 7) of the laminate 4 is thus, in principle, performed as a short coaxial line. The outer conductor of the coaxial line is formed by a number of through-plated holes 12, 13, 23, 33, 43 in close circular form (in FIGS. 1, 2 horseshoe-shaped) around a center conductor also consisting of through-plated holes 24, 34. The outer conductor is connected to the ground planes 31, 11 and 45 of the laminates 1-4. At the same time it serves as a suppressor of undesired modes in the microwave signals fed to the transition via the conductor 21.

Figure 3:
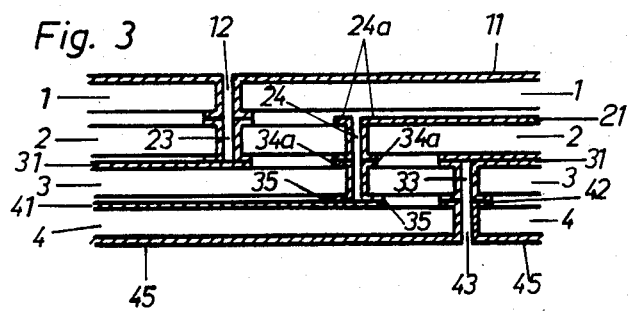
FIG. 3 shows the transition according to FIG. 1 in cross section.

In FIG. 3 the stripline transition according to FIG. 1 is shown in cross section. On the two laminates 2 and 4 the stripline layers are assembled as a complete multilayer unit, where contact between the through-plated holes of the layers is attained by reason of the construction wherein a collar, for example 24a, which indicates a hole in the center conductor, is pressed against a corresponding collar 34a in the subsequent layer. The same is valid for the outer conductor where, for example, the horseshoe-shaped section 14 is pressed against 22, the section 42 against the section 36 etc, so that the holes form a transition through the laminates. The plated holes are made in each layer, in order to obtain the highest possible flexibility in the construction. The laminate slabs are joined together, for example by gluing.

The construction makes it possible for a great number of circuits to be integrated into one unit, joined as described above, by through-plated holes. It is characteristic that the holes are not plated through the whole structure (as in ordinary multilayer techniques for printed circuits) but provide space for other circuits in the layers where the holes are not present.

Figure 4:
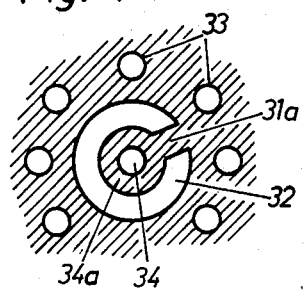
FIG. 4 shows an impedance matching on one of the sides according to FIG. 2.

For impedance matching of a transition, compensating reactances can be introduced in connecting stripline circuits. In the present construction, however, this can be achieved in a simple way by an inductive matching in the coaxial structure. No extra space is required for this. FIG. 4 shows the lead-through according to FIG. 1 from the underside of the laminate 2 ("side 4"). From the collar 34a there is a stub 31a between the collar and the ground plane 31 which bridges the isolated area 32 and which gives the inductive matching in the coaxial structure.

What is claimed is:

1. An impedance matching coaxial transition for microwave signals comprising first and second laminates, at least one intermediate laminate between the first and second laminates, an input conductor from a stripline circuit on the first laminate, an output conductor to a stripline circuit on the second laminate, each of said laminates having a conducting region on one side thereof, a center through-plated hole in each of said first and intermediate laminates, a conducting collar for each hole on each laminate on at least one side of the respective laminate, a plurality of further through plated holes in each of said laminates, the further through-plated holes in the first and intermediate laminates respectively surrounding said center holes therein, each of said further holes being in conducting connection with another hole in said plurality of holes by a first conducting region on one side of the respective laminate and by a second conducting region on the other side of said laminate, said collar and said second conducting region defining a slightly elevated area on the respective side of each laminate, said center through-plated hole in said first laminate forming a first conducting structure together with the corresponding center hole in said intermediate laminate and said elevated area of the respective side of each laminate and defining a conducting connection between said input and output conductors, said plurality of through-plated holes in each of the laminates forming a second conducting structure together with the corresponding plurality of through-plated holes in the other laminates and defining the return conductor of the coaxial transition.

2. An impedance matching coaxial transition as claimed in claim 1 wherein said second conducting region is horseshoe-shaped.

3. An impedance matching coaxial transition as claimed in claim 1 wherein said first conducting region on the intermediate laminate comprises a conducting layer which connects with said further through-plated holes to conductively connect the same and an isolating area which isolates the first conducting layer from the respective center through plated hole.

4. An impedance matching coaxial transition as claimed in claim 3 wherein the first conducting region on the intermediate laminate includes a stub bridging the isolating area for inductive match in the coaxial transition.

* * * * *